United States Patent [19]
Yahata

[11] Patent Number: 5,399,915
[45] Date of Patent: Mar. 21, 1995

[54] DRIVE CIRCUIT INCLUDING TWO LEVEL-SHIFT CIRCUITS

[75] Inventor: Yukio Yahata, Tokyo, Japan
[73] Assignee: NEC Corporation, Tokyo, Japan
[21] Appl. No.: 35,155
[22] Filed: Mar. 22, 1993

[30] Foreign Application Priority Data

Mar. 23, 1992 [JP] Japan .................................... 4-064415

[51] Int. Cl.⁶ .............................................. G05F 1/613
[52] U.S. Cl. ...................................... 327/108; 327/333; 327/543
[58] Field of Search ............ 307/261, 264, 268, 296.1, 307/296.7, 296.8, 296.4, 296.5

[56] References Cited

U.S. PATENT DOCUMENTS

| | | |
|---|---|---|
| 4,663,701 | 5/1987 | Stotts .................................. 307/264 |
| 4,906,056 | 3/1990 | Taniguchi ........................... 307/264 |
| 4,996,443 | 2/1991 | Tateno ................................ 307/264 |
| 5,191,233 | 3/1993 | Nakano .............................. 307/264 |

Primary Examiner—Steven L. Stephan
Assistant Examiner—Shawn Riley
Attorney, Agent, or Firm—Sughrue, Mion, Zinn, Macpeak & Seas

[57] ABSTRACT

A drive circuit for an Electroluminesent display panel is disclosed in which a ground line is divided into two line, one of which is provided for a signal input stage and the other of which is provided for a signal output stage. The signal output stage includes two level-shift circuits, one operating by receiving a first power voltage between a first power line and the other ground line and the other operating by receiving a second power voltage between a second power line and the other ground line.

7 Claims, 5 Drawing Sheets

DRIVE CIRCUIT INCLUDING TWO LEVEL-SHIFT CIRCUITS

BACKGROUND OF THE INVENTION

The present invention relates to a drive circuit and, more particularly, to such a circuit fabricated as a semiconductor integrated circuit (IC) for driving an electroluminescent (CL) display panel.

As well known in the art, a few hundred volts are required to drive the EL display panel. For this reason, a drive circuit for the EL display panel was constructed to employ discrete semiconductor elements such as thyristors.

However, high withstand device structure and process has been recently developed and put into practical use. A drive circuit fabricated as an IC has become available.

Referring to FIG. 1, such a drive IC 1 is shown. Input signal IN representative of image data to be displayed is supplied in series to an input pin 3 of the IC 1. Connected to the pin 3 is an input data processing circuit 2 which includes a shift register (not shown) for converting the input signal supplied in series into parallel data signals D1 to Dn. These data signals D1 to Dn are supplied to a plurality of output stages 100-1 to 100-n, respectively, which are provided in one-to-one correspondence with the data signals D. Each of the output stages 100 produces and outputs an output signal OUT to a corresponding one of output pins 400-1 to 400-n which are in turn connected directly to the EL display panel (not shown).

As described above, the input signal IN represents image data to be displayed produced by a data processing unit such as microcomputer. Accordingly, the input signal IN has a logic amplitude changing typically between +5 V and 0 V. On the other hand, each output signal OUT directly drives the EL panel and thus each has another logic amplitude changing between a few hundred volts and 0 V. That is, the drive IC 1 is also required to have a level converting function of converting the small logic amplitude of the input signal IN into a required, large logic amplitude.

For this purpose, three power pins 4, 5 and 6 are provided in the drive IC 1. The first power pin 4 is supplied with a first power voltage $V_{DD1}$ of 5 V, and the second power pin 5 is supplied with a second power voltage $V_{DD2}$ of 200 V, for example. The third power pin 6 is supplied with a ground voltage GND of 0 V. The input data processing unit 2 is connected to the power pins 4 and 6 to deal with the input signal IN. On the other hand, each of the output stages 100-1 to 100-n is connected to the power pins 4, 5 and 6 to perform the level converting function.

Turning to FIG. 2, there is shown a circuit diagram of the output stage 100-1. It should noted that each of the output stages 100-1 to 100-n has the same circuit construction as the others. The output stage 100-1 has a data terminal 30 supplied with an input data signal D1, a first power terminal 40 connected to the pin 4 to receive $V_{DD1}$ power voltage, a second power terminal 50 connected to the pin 5 to receive $V_{DD2}$ power voltage, a ground terminal 60 connected to the pin 6 to receive ground voltage, and an output terminal 70 connected the pin 400-1 to supply the output data signal OUT 1. The output stage 100-1 further has an inverter INV, three P-channel MOS transistors P101 to P103 and three N-channel MOS transistors N101 to N103 which are connected as shown. In particular, the transistors P101, P102, N101 and N102 constitute a level-shift circuit 10 to drive the output transistors P101 and N103.

As apparent from the circuit construction shown in FIG. 2, the input data signal D1 having a small logic amplitude between $V_{DD1}$ level and the ground level is changed to the output signal OUT 1 having a large logic amplitude between the $V_{DD2}$ level and the ground, as shown in FIG. 3. The EL display panel is thus driven directly by the drive IC 1.

Since the drive IC 1 is of a complementary MOS (CMOS) construction, power consumption in a steady state in which the input data signal D is in one of two logic states is substantially zero, as well known in the art. That is, no dc current flows between the power terminals 50 and 60 in the steady state. However, as also known in the art, in a transition state in which the signal changes from one logic level to the other logic level, a dc current flows between the power terminals 50 and 60. Moreover, such a dc current is considerably large, because the transistors P101 to N103 are made with a large size to have a high withstand voltage. As a result, there occurs a relatively large voltage change on a ground line GLN (see FIG. 1) due to the impedance thereof during every transistor period, as shown in FIG. 3. This voltage change provides the input data processing unit 2 with a change of the ground voltage. For this reason, the unit 2 is often subjected to the malfunction.

SUMMARY OF THE INVENTION

It is therefore an object of the present invention to provide an improved drive circuit.

Another object of the present invention is to provide a drive circuit in which a signal input stage is free from a maloperation caused by a voltage change on a ground line.

A drive circuit according to the present invention is characterized by providing an additional level-shift circuit between the above-mentioned inverter and the above-mentioned level-shift circuit and further providing two ground lines independently of and separately from each other. One of the two ground lines is provided for the above two level-shift circuits and output transistors, and the other ground line is provided for the inverter and signal input stage. However, the additional level-shift circuit is connected to the first power pin, not the second power pin to which the remaining level-shift circuit is connected.

With the above construction, the ground line for the signal input stage is not supplied with the voltage change of the ground line for the output stage.

BRIEF DESCRIPTION OF THE DRAWINGS

The above and other objects, features and advantages of the present invention will be more apparent from the following description taken in conjunction with the accompanying drawings, in which.

DETAILED DESCRIPTION OF THE INVENTION

Figure 1:
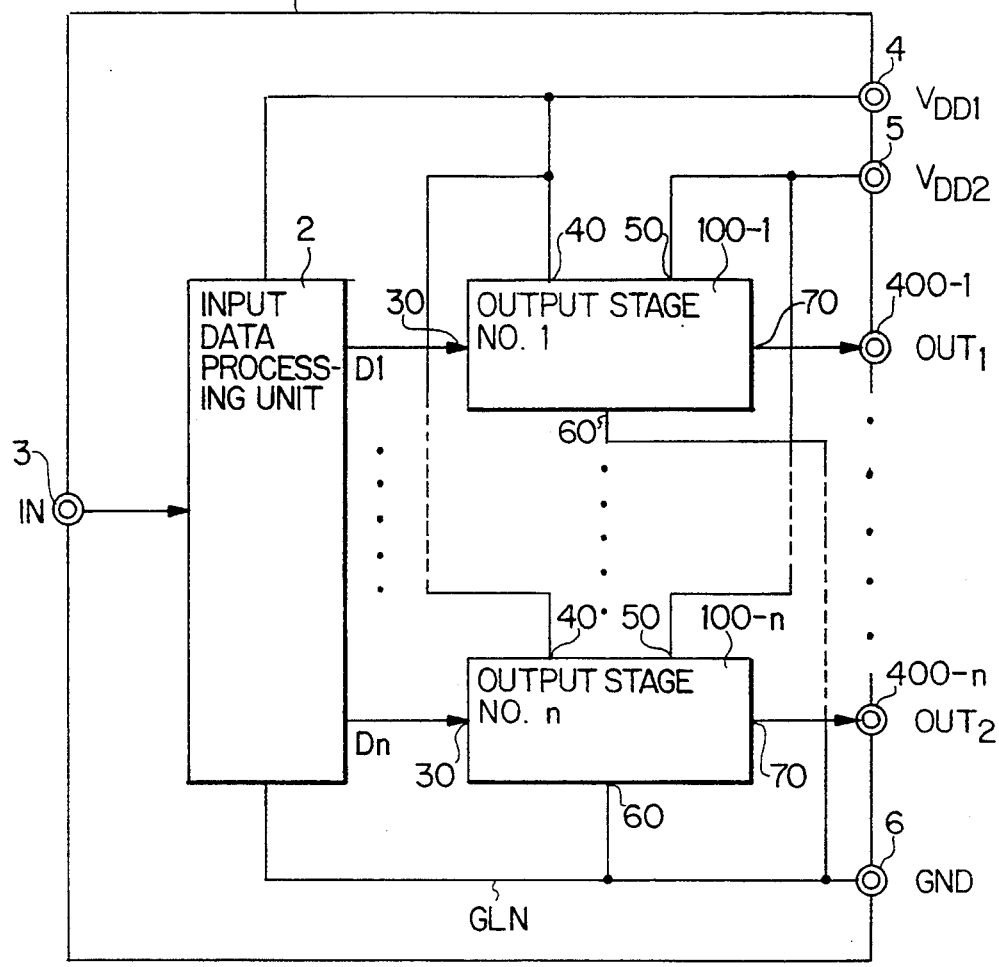
FIG. 1 is a block diagram illustrative of a prior art drive IC.
Figure 4:
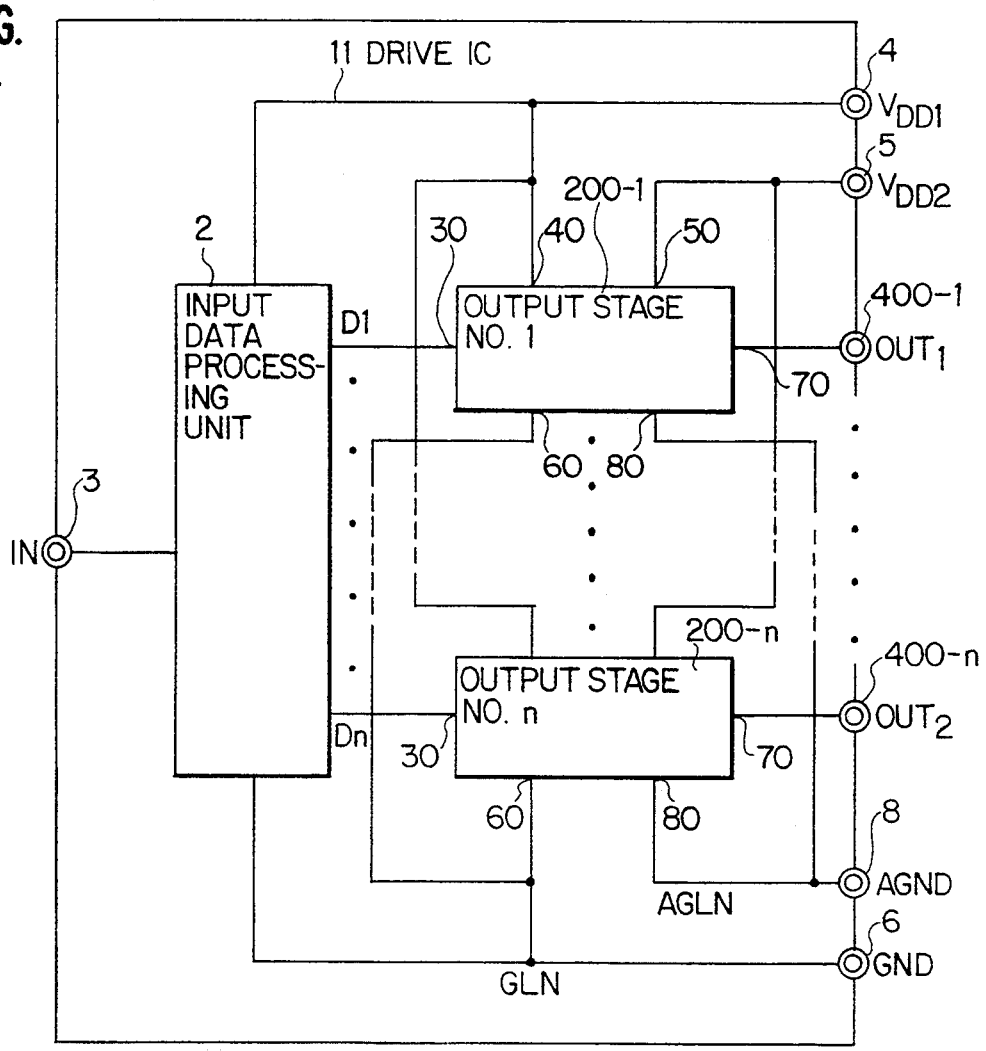
FIG. 4 is a block diagram illustrative of an embodiment of the present invention.

Referring to FIG. 4, there is shown a drive IC 11 according to an embodiment of the present invention in which the same constituents as those shown in FIG. 1 are denoted by the same reference numerals to omit the further description thereof. In this IC 11, there is further provided an additional ground pin AGND 8 supplied with the ground voltage. This pin 8 is connected via a ground line AGLN, which is provided independently of and separately from the ground line GLN, to an additional ground terminal 80 of each of output stages 200-1 to 200-n.

Figure 2:
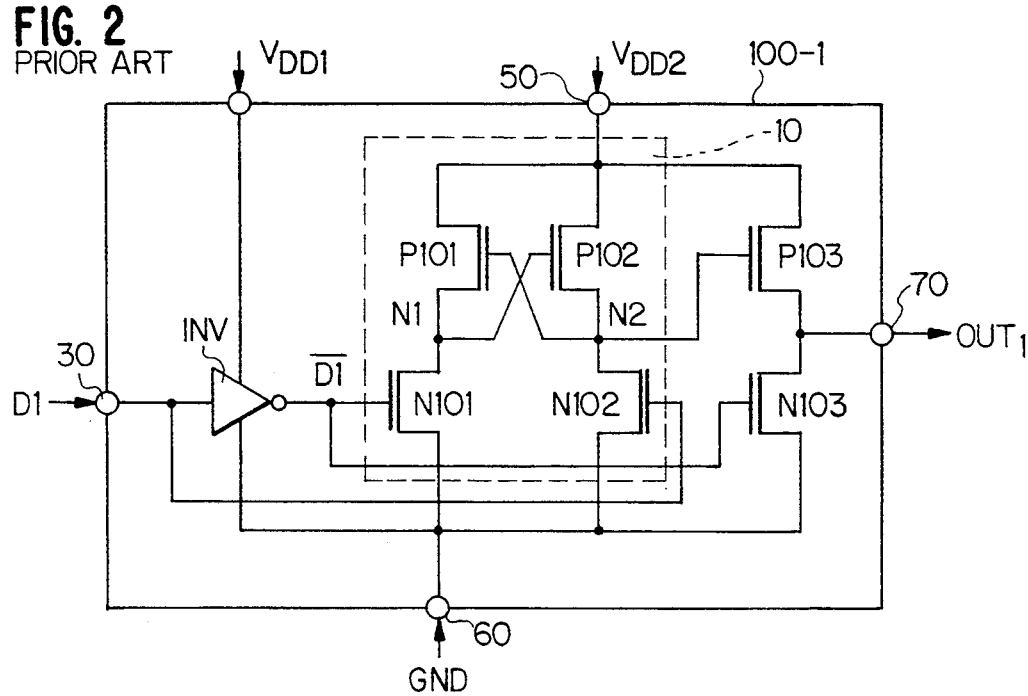
FIG. 2 is a circuit diagram illustrative of one output stage shown in FIG. 1.
Figure 3:
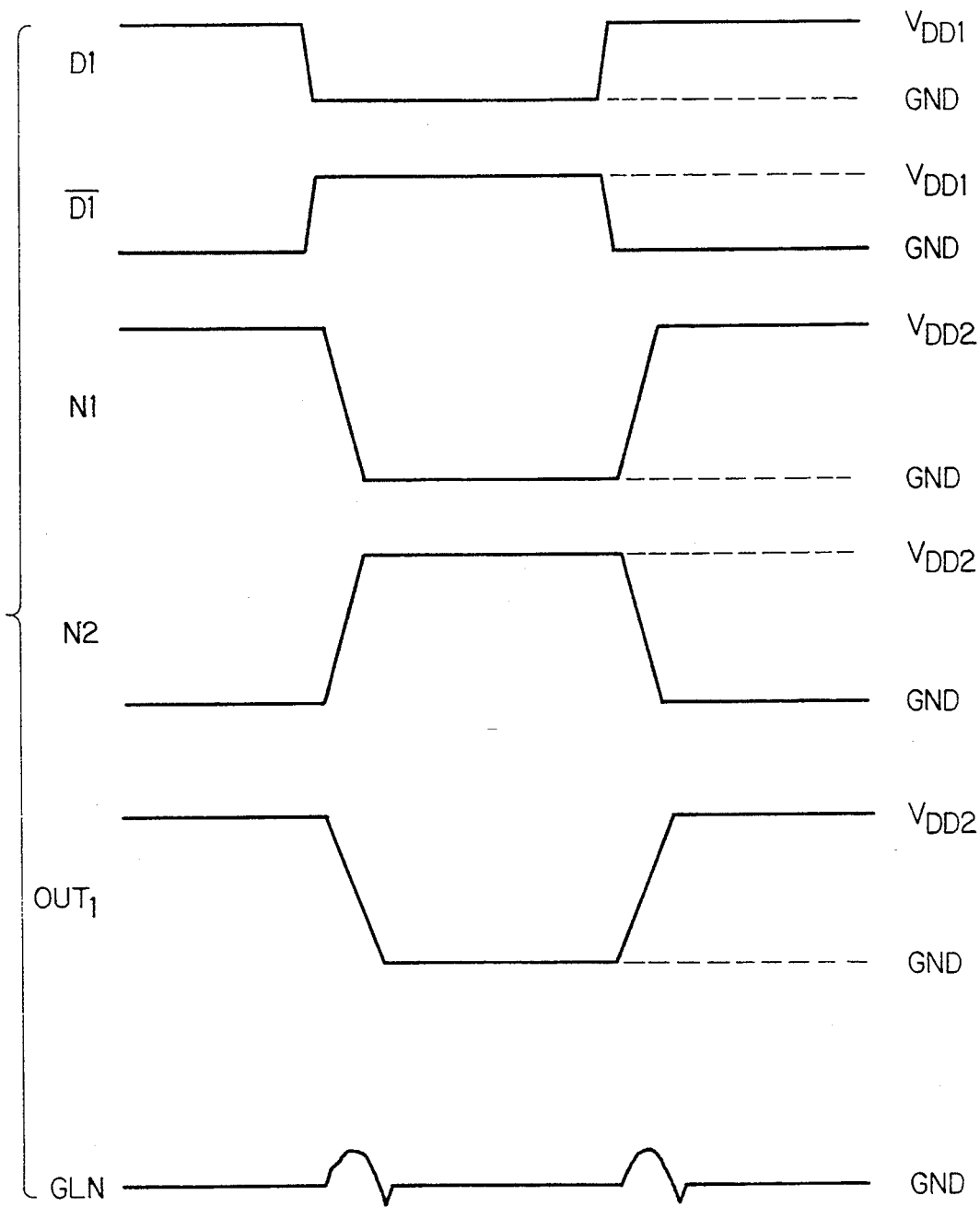
FIG. 3 is a timing chart representative of an operation of the output stage shown in FIG. 2.
Figure 5:
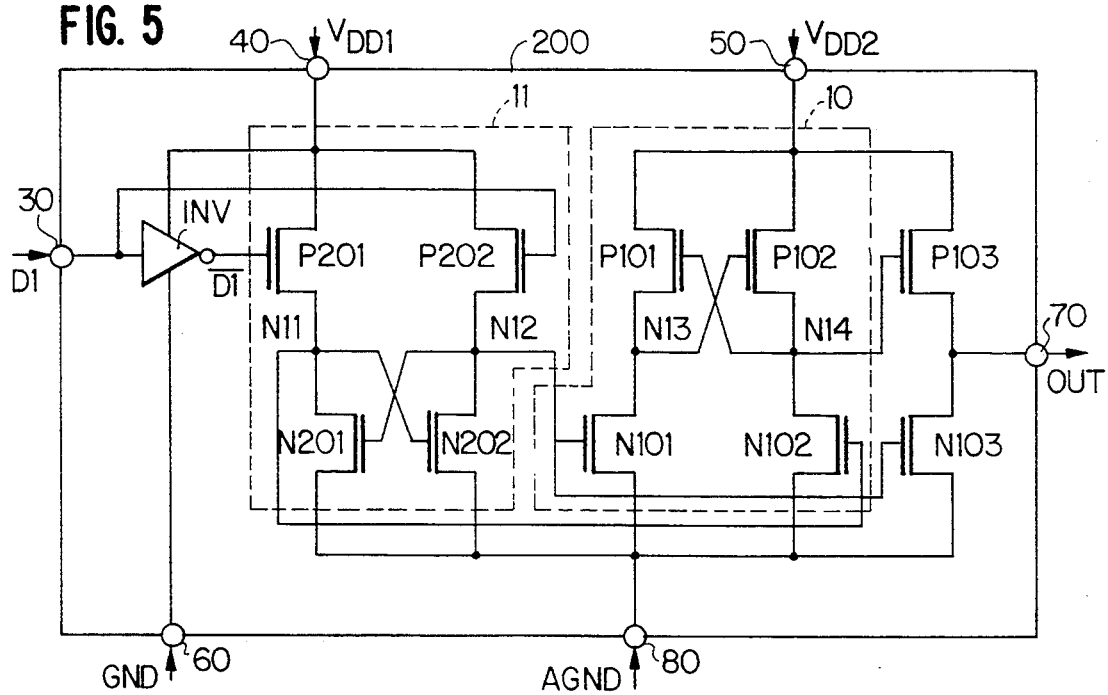
FIG. 5 is a circuit diagram illustrative of an output stage shown in FIG. 4.

Turning to FIG. 5, each of the output stages 200 further includes a level-shift circuit 11 in addition to the inverter INV, the level-shift circuit 10 and the output transistors P103 and N103 shown in FIG. 2. The level-shift circuit 11 includes two P-channel MOS transistors P201 and P202 and two N-channel MOS transistors N201 and N202 which are connected as shown. It should be noted however that while the circuit 11 is connected to the terminal 80 together with the level-shift circuit 10 and the output transistor N103, it is connected to the $V_{DD1}$ terminal 40 unlike to the circuit 10. The circuit 11 therefore supplies the true and complementary levels of the input data D1 to the level-shift circuit 10 without changing the logic amplitude of the input data signal D1.

Figure 6:
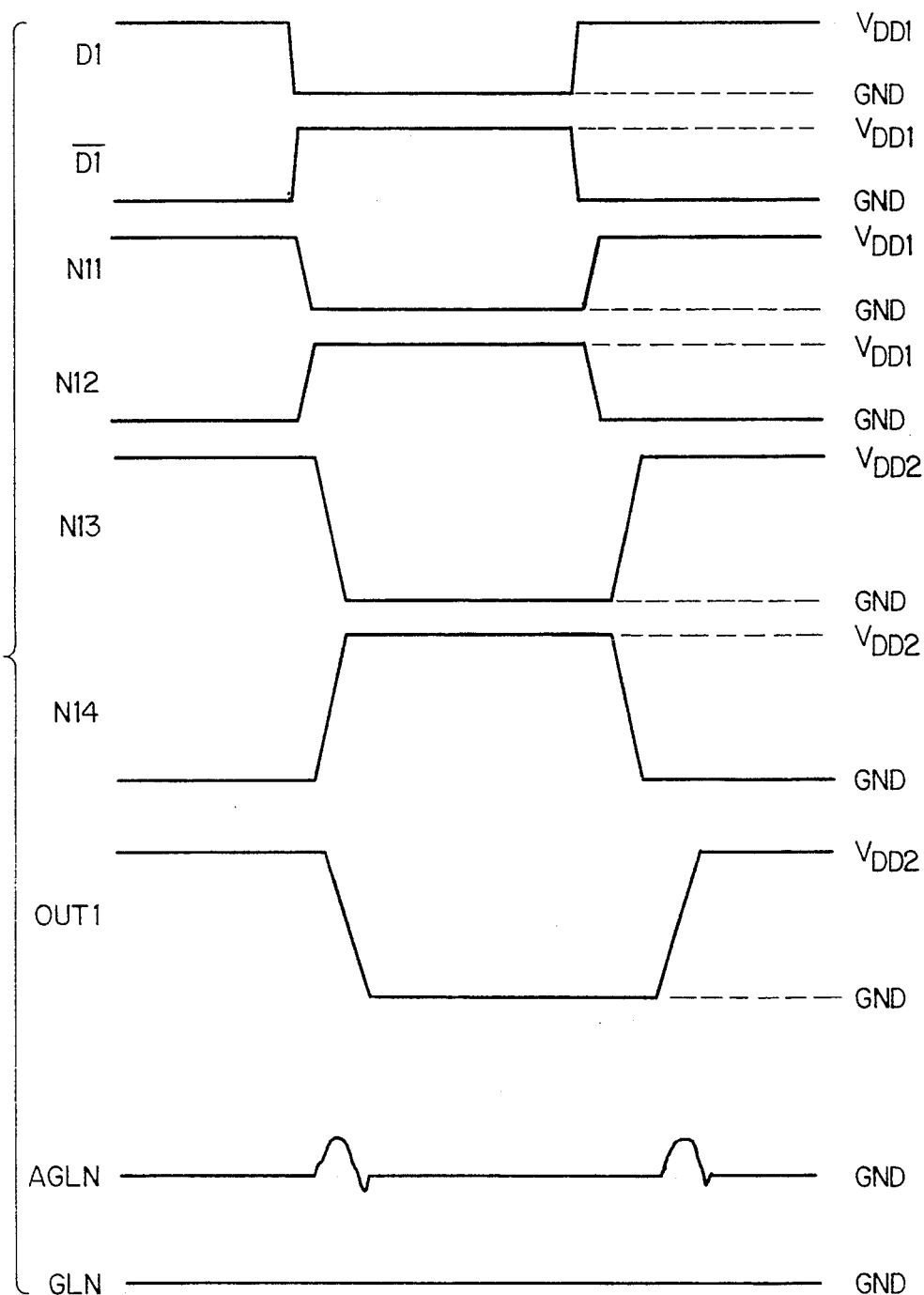
FIG. 6 is a timing chart representative of an operation of the output stage shown in FIG. 5.

As apparent from the circuit diagram shown in FIG. 5, the present output stage 200 performs substantially the same operation as that of FIG. 2 to convert the small logic amplitude of the input data signal D1 into the large logic amplitude required as an output signal OUT, as shown in FIG. 6. However, the voltage change caused during the signal transition period occurs only on the ground line AGLN. Substantially no voltage change occurs on the other ground line GLN. The input data processing unit is therefore free from the voltage change of the ground line to continue to perform an accurate operation.

Moreover, as shown in FIG. 6, the voltage change on the ground line AGLN often appears in a negative direction. In that case, however, the voltage level at a node N11 or N12 is also shifted to a negative level. Therefore, the transistor N101 or N102 is held in the non-conductive state and no undesired power is consumed.

An IC is actually composed of a semiconductor chip on which the respective circuits as well as interconnection lines and so-called bonding pads are formed and a package encapsulating the chip. In the drive IC 11 shown in FIG. 4, therefore, the semiconductor chip for the drive circuit has two ground pads (not shown) and the package has two ground pins 6 and 8 connected via a bonding wire to the corresponding bonding pad.

Figure 7:
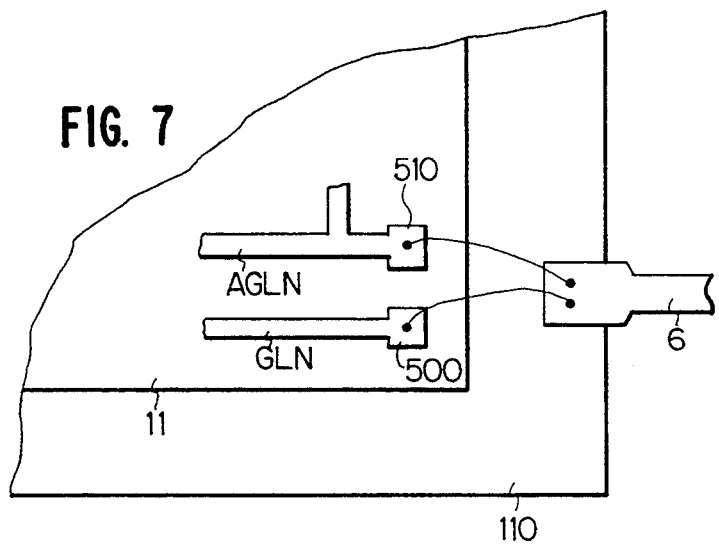
FIG. 7 is a plan view illustrative of a part of a drive IC according to another embodiment of the present invention.

However, the pin can be regarded as a power source having a very low impedance. Accordingly, only one ground pin 6 can be provided as shown in FIG. 7 as another embodiment of the present invention. In this case, a bonding pad 500 for the ground line GLN and a bonding pad 510 for the other ground line AGLN are connected to the ground pin 6 by the respective bonding wires.

Figure 8:
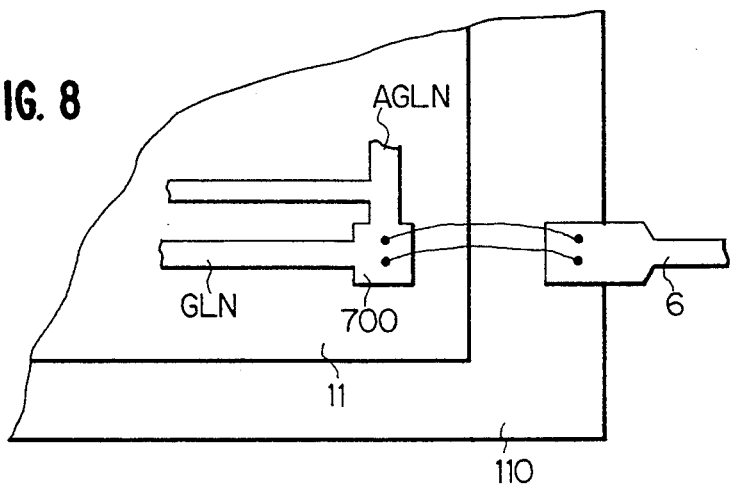
FIG. 8 is a plan view illustrative of a part of a drive IC according to still another embodiment of the present invention.

These bonding pads 500 and 510 can be replaced by a single bonding pad 700, as shown in FIG. 8. In this case, the pad 700 may be connected to the pin 6 by a plurality of bonding wires to reduce the total impedance and inductance thereof. However, the ground lines GNL and AGLN must be provided independently of and separately from each other.

Figure 9:
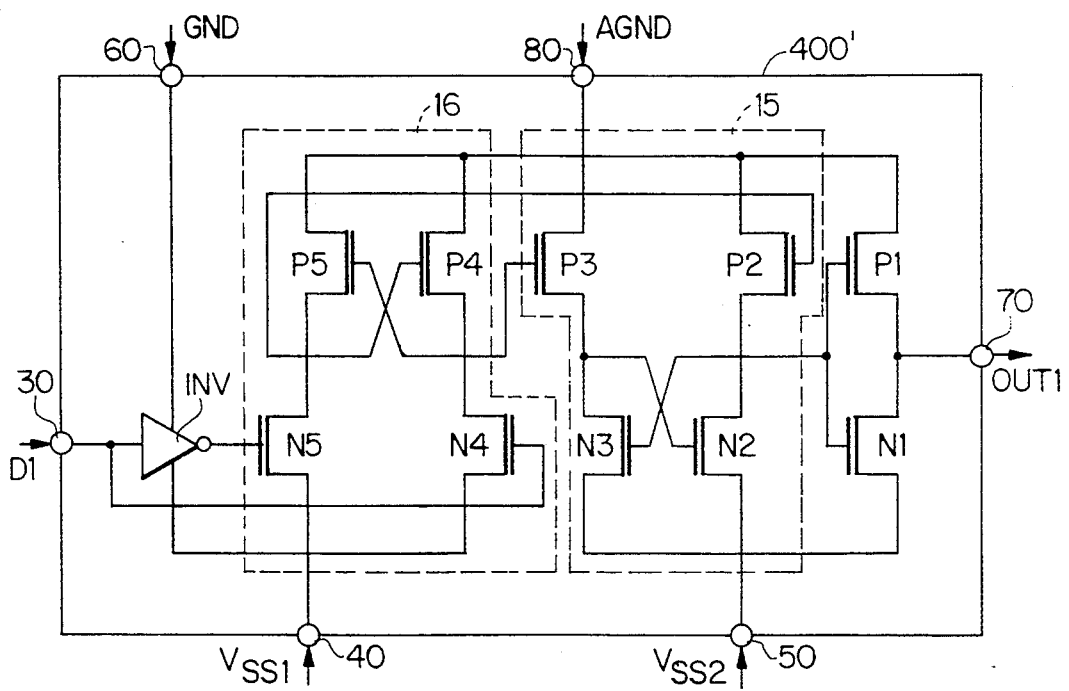
FIG. 9 is a circuit diagram illustrative of an output stage of a drive IC according to still another embodiment of the present invention.

The EL display panel sometimes requires negative driving voltages. In this case, negative power voltage $V_{SS1}$ and $V_{SS2}$ are supplied to the terminals 40 and 50, respectively, as shown in FIG. 9. This output stage 400' includes five P-channel MOS transistors P1 to P5, five N-channel MOS transistors N1 to N5, and an inverter INV. The operation of this stage is the substantially same as that of FIG. 5.

It is apparent that the present invention is not limited to the above embodiments but may be modified and changed without departing from the scope and spirit of the invention.

What is claimed is:

1. A transistor circuit comprising a first power line transferring a first power voltage, a second power line transferring a second power voltage different from said first power voltage, a third power line transferring a reference voltage, a fourth power line transferring said reference voltage independently of said third power line, a first circuit connected between said first and third power lines and responding to an input data signal supplied thereto to produce true and complementary levels of said input data signal, and a second circuit connected between said second and third power lines and responding to said true and complementary levels derived from said first circuit to produce an output signal, said first circuit including first and second transistors having source-to-drain paths thereof connected in series between said first and third power lines and third and fourth transistors having source-to-drain paths thereof connected in series between said first and third power lines, said second transistor having a gate connected to a node of said third and fourth transistors and said fourth transistor having a gate connected to a node of said first and second transistors, and said second circuit including fifth and sixth transistors having source-to-drain paths thereof connected in series between said second and third power lines.

2. The transistor circuit as claimed in claim 1, wherein said input data signal is supplied to said first circuit through a logic gate connected between said first and fourth power lines.

3. The transistor circuit as claimed in claim 2, wherein said logic gate comprises an inverter.

4. A transistor circuit comprising a first power line transferring a first power voltage, a second power line transferring a second power voltage different from said first power voltage, a third power line transferring a reference voltage, a fourth power line transferring said reference voltage independently of said third power line, a first circuit connected between said first and third power lines and responding to an input data signal supplied thereto to produce true and complementary levels of said input data signal, and a second circuit connected between said second and third power lines and responding to said true and complementary levels derived from said first circuit to produce an output signal, said first circuit including first and second transistors having source-to-drain paths thereof connected in series between said first and third power lines and third and fourth transistors having source-to-drain paths thereof connected in series between said first and third power lines, said second transistor having a gate connected to a node of said third and fourth transistors and said fourth transistor having a gate connected to a node of said first and second transistors, and said second circuit including fifth and sixth transistors having source-to-drain paths thereof connected in series between said second and third power lines and said second circuit including fifth and sixth transistors connected in series between said second and third power lines and seventh and eighth transistors connected in series between said second and third power lines, said fifth transistor having a gate connected to a node of said seventh and eighth transistors and said seventh transistor having a gate connected to a node of said fifth and sixth transistors.

5. The transistor circuit as claimed in claim 4, wherein said first power voltage is smaller in absolute value than said second power voltage.

6. A transistor circuit comprising:

a first power line transferring a first power voltage;

a second power line transferring a second power voltage different from said first power voltage;

a third power line transferring a reference voltage;

a fourth power line transferring said reference voltage independently of said third power line;

a first circuit including first and second transistors having source-to-drain paths thereof connected in series between said first and fourth power lines for outputting a data signal;

a second circuit including third and fourth transistors having source-to-drain paths thereof connected in series between said first and third power lines and responding to said data signal supplied thereto to produce an internal signal; and a third circuit including fifth and sixth transistors having source-to-drain paths thereof connected in series between said second and third power lines and generating in response to said internal signal an output signal.

7. A transistor circuit as claimed in claim 6, wherein said first circuit outputs said data signal with a first amplitude corresponding to a difference between said first and fourth power voltages, said second circuit produces said internal signal with said first amplitude, and said third circuit generates said output signal with a second amplitude corresponding to a difference between said second and third power voltages.

* * * * *